(12) United States Patent
Takahashi et al.

(10) Patent No.: US 9,605,855 B2
(45) Date of Patent: Mar. 28, 2017

(54) AIR CONDITIONING SYSTEM USING OUTSIDE AIR

(75) Inventors: Masaki Takahashi, Hachioji (JP); Yuichiro Minegishi, Hino (JP); Shunsuke Ohga, Chiba (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 923 days.

(21) Appl. No.: 13/993,911

(22) PCT Filed: Mar. 13, 2012

(86) PCT No.: PCT/JP2012/056475
§ 371 (c)(1),
(2), (4) Date: Jul. 2, 2013

(87) PCT Pub. No.: WO2012/124712
PCT Pub. Date: Sep. 20, 2012

(65) Prior Publication Data
US 2013/0280999 A1      Oct. 24, 2013

(30) Foreign Application Priority Data

Mar. 14, 2011  (JP) .................................. 2011-055590

(51) Int. Cl.
*F24F 9/00*  (2006.01)
*F24F 7/08*  (2006.01)
(Continued)

(52) U.S. Cl.
CPC .................. *F24F 7/08* (2013.01); *F24F 9/00* (2013.01); *F24F 11/0001* (2013.01); *H05K 7/20745* (2013.01)

(58) Field of Classification Search
CPC ... F24F 7/08; F24F 2009/002; F24F 2009/007
(Continued)

(56) References Cited

U.S. PATENT DOCUMENTS 3,859,900 A * 1/1975 Fordsmand ............... F24F 9/00
454/190
3,998,142 A * 12/1976 Foreman ............. A61G 13/108
128/897
(Continued)

FOREIGN PATENT DOCUMENTS

JP    2004-138336 A    5/2004
JP    2009-036490 A    2/2009
(Continued)

OTHER PUBLICATIONS

Japan Patent Office, "Office Action for JP 2013-504746," Apr. 7, 2014.

*Primary Examiner* — Steven B McAllister
*Assistant Examiner* — Jonathan Cotov
(74) *Attorney, Agent, or Firm* — Manabu Kanesaka (57) ABSTRACT

An air conditioning system utilizing outdoor air for cooling an indoor space wherein a rack is disposed, includes at least one rack disposed in the indoor space, the rack having the heating element, an air inlet face and an air discharge face; and at least one air conditioning device using outdoor air for cooling and unitized in accordance with the at least one rack, the air conditioning device having an air supply face and a cold air supply unit for generating cold air and being disposed in vicinity of the rack such that the air supply face faces the air inlet face to form a rack row and an air conditioning device row substantially parallel to the rack row, the rack row being formed of the at least one rack and the air conditioning device row being formed of the at least one air conditioning device.

11 Claims, 5 Drawing Sheets

(51) Int. Cl.
  *F24F 11/00* (2006.01)
  *H05K 7/20* (2006.01)
(58) Field of Classification Search
  USPC ........................................................ 454/184
  See application file for complete search history.

(56) References Cited

U.S. PATENT DOCUMENTS

| | | | | |
|---|---|---|---|---|
| 7,259,963 B2* | 8/2007 | Germagian | ........ | H05K 7/20745 361/690 |
| 8,764,528 B2* | 7/2014 | Tresh | ................. | H05K 7/20745 361/691 |
| 2006/0260338 A1* | 11/2006 | VanGilder | .......... | H05K 7/20745 62/259.2 |
| 2007/0135032 A1* | 6/2007 | Wang | ........................ | F24F 9/00 454/184 |
| 2009/0117842 A1* | 5/2009 | Jie | ........................ | H05K 7/20745 454/184 |
| 2009/0137198 A1* | 5/2009 | Tsubata | ..................... | F24F 9/00 454/191 |
| 2009/0211272 A1* | 8/2009 | Larsen | .................... | F24F 5/0035 62/89 |
| 2010/0248609 A1* | 9/2010 | Tresh | ................. | H05K 7/20745 454/184 |
| 2010/0291856 A1* | 11/2010 | Berben | ...................... | F24F 9/00 454/191 |
| 2011/0239683 A1* | 10/2011 | Czamara | ............ | H05K 7/20745 62/259.4 |

FOREIGN PATENT DOCUMENTS

| | | |
|---|---|---|
| JP | 2009-111300 A | 5/2009 |
| JP | 2009-130272 A | 6/2009 |
| JP | 2009-257721 A | 11/2009 |
| JP | 2009-264598 A | 11/2009 |
| JP | 2010-002148 A | 1/2010 |
| JP | 2010-054090 A | 3/2010 |
| JP | 2010-107188 A | 5/2010 |
| JP | 2010-122747 A | 6/2010 |
| JP | 2010-230210 A | 10/2010 |
| JP | 2010-267841 A | 11/2010 |
| JP | 2011-027400 A | 2/2011 |
| WO | 2010/095931 A1 | 8/2010 |

* cited by examiner

AIR CONDITIONING SYSTEM USING OUTSIDE AIR

RELATED APPLICATIONS

The present application is National Phase of International Application No. PCT/JP2012/056475 filed Mar. 13, 2012, and claims priority from Japanese Application No. 2011-055590 filed on Mar. 14, 2011.

TECHNICAL FIELD

The present invention relates to an air conditioning system using outdoor air.

BACKGROUND ART

For example, a large number of computers (server devices) or the like have been heretofore disposed in a server room or the like in a data center or an enterprise. There is a possibility that heat generated in the larger number of server devices may increase the room temperature of such a server room, thereby causing out of control or breakdown of any one of the server devices. Therefore, the server room uses an air conditioning system for keeping the overall temperature of the room constant. Such an air conditioning system is operated almost full-time so that it is operated even in winter.

In the background-art air conditioning system for such a server room or the like, low-temperature air (cold air) blown out from air conditioning devices flows into the server room while contacting with server devices in server racks to cool the server devices in order to attain stability of the room temperature of the server room. There is used a circulation system in which air (warm air) consequently warmed up by heat of the server devices is returned from the server room into the air conditioning devices and cooled by the air conditioning devices so that the cooled air is blown out again as the cold air and fed into the server room again.

An air conditioning device using outdoor air for generating the cold air has been known. That is, there has been known an air conditioning device utilizing outdoor air in which the warm air (air returned from the server room) and outdoor air are made to pass through a heat exchanger to perform heat exchange between the warm air and the outdoor air so that the warm air is cooled and changed into cold air by the outdoor air.

A background-art technique described in Patent Literature 1 has been known.

For example, a configuration shown in FIGS. 1(A) and 1(B) has been disclosed in Patent Literature 1. That is, first, one cabinet group is formed in such a manner that a plurality of cabinets is arranged in a single horizontal row in an X direction. Such cabinet groups are provided in a plurality of rows. A shielding unit including first and second vertical curtain portions, a horizontal curtain portion and an end vertical curtain portion, is attached to cable racks corresponding to two rows of cabinet groups opposite to each other. The shielding unit forms a shielded space (cold aisle) for cooling in a passage where the two rows of cabinet groups face each other. For example, these curtain portions are made of vinyl chloride sheets, panels, or the like.
Patent Literature 1: JP-A-2009-36490

DISCLOSURE OF INVENTION

Here, in the case of the air conditioning device utilizing outdoor air, it is necessary to dispose a duct for sucking outdoor air from the outside of a building, a duct for ejecting the sucked outdoor air to the outside of the building and a duct for sucking indoor air (sucking warm air) and feeding out the indoor air (feeding out cold air) in order to obtain such a configuration that outdoor air is used for cooling return air. Particularly, in the case where the server room is provided in the innermost of the building (in the case where the server room is far from the external wall of the building), there is a high probability that the configuration will become complex and the space of installation will become large. Incidentally, the indoor air means air in the building.

Heating elements such as server devices as main subjects to be cooled are often provided additionally afterward. For this reason, increase in quantity of generated heat may cause insufficient air conditioning capacity, so that it may be necessary to additionally provide the air conditioning devices utilizing outdoor air. In this case, by the installation of the ducts or the like, there is a possibility that the installation will be difficult because of shortage of the installation space. Or even when the installation can be done, there is a high possibility that the labor and cost for installation will become large because it will be necessary to install long ducts. On the contrary, it may be conceived that spare air conditioning devices utilizing outdoor air are installed in advance in prospect of additional provision of server devices or the like. However, in this case, the spare air conditioning devices utilizing outdoor air will become wasteful if server devices or the like are not provided additionally.

In this manner, it is desirable that the air conditioning devices utilizing outdoor air are installed or provided additionally afterward easily.

It is conceived that curtain portions made of vinyl chloride sheets, panels or the like are used for forming a shielded space (to prevent cold air and warm air from being mixed with each other) as in the Patent Literature 1 or the like in order to improve cooling efficiency. However, when server devices or the like and air conditioning devices utilizing outdoor air are provided additionally, it is necessary to reinstall the curtain portions in accordance with the additional provision. For this reason, it is desirable that such labor is not required.

An object of the invention relates to an air conditioning system using outdoor air for cooling the inside of a room and is to dispose unitized air conditioning devices in the vicinity of racks. In this connection, it is provided an air conditioning system utilizing outdoor air in which installation is made in such a manner that the width of an air conditioning device row is larger than the width of a rack row so that heating elements disposed in the racks are cooled and an air curtain for preventing air supply and return air from being mixed with each other can be formed.

The air conditioning system utilizing outdoor air according to the invention is an air conditioning system using outdoor air for cooling an indoor space where racks mounting heating elements thereon are disposed, and the system has the following configuration.

That is, first, air conditioning devices which use outdoor air for cooling and which are unitized in accordance with one or more racks are disposed in the vicinity of racks so that air supply inlet faces of the air conditioning devices face air inlet faces of the racks, respectively. In this manner, an air conditioning device row formed of one or more air conditioning devices is provided substantially in parallel to a rack row formed of the one or more racks.

Each of the air conditioning devices has a cold air supplying unit which feeds cold air from the air supply face to a cold space as a space between the rack row and the air conditioning device row to supply the cold air to each heating element in the corresponding rack and which sucks warm air ejected from an air discharge face of the rack and cools the warm air by using the outdoor air to generate the cold air.

The horizontal width of the air conditioning device row is set to be larger than the horizontal width of the rack row, thereby forming air curtains at opposite ends of the cold space.

For example, the air conditioning devices are additionally disposed at the opposite ends of the air conditioning device row, thereby achieving the horizontal width of the aforementioned air conditioning device row larger than the horizontal width of the rack row, and thereby forming air curtains at the opposite ends of the cold space.

In the air conditioning system utilizing outdoor air, for example, the air curtains are formed in such a manner that the cold air supplying units of the additionally disposed air conditioning devices feed cold air from the air supply faces, thereby sucking the cold air into the return air inlets without supply of the cold air to the racks.

In the air conditioning system utilizing outdoor air, for example, when a new rack is added to one or each of the opposite ends of the rack row, the air conditioning device in which the air curtain has been formed in the position of the rack, is set as an air conditioning device corresponding to the added rack and a new air conditioning device is additionally disposed at one or each of the opposite ends of the air conditioning device row, thereby forming the air curtain.

DESCRIPTION OF EMBODIMENTS

An embodiment of the invention will be described below with reference to the drawings.

FIGS. 1(a) and 1(b) are views showing a basic configuration of an air conditioning system utilizing outdoor air according to this embodiment.

FIG. 1(a) is a sectional view and FIG. 1(b) is a perspective view.

FIGS. 2(a) and 2(b) show a specific example of a data center to which the basic configuration of the air conditioning system utilizing outdoor air according to this embodiment, is applied. FIGS. 2(a) and 2(b) show a typical example which will be referred to as warehouse type modular data center. As shown in FIGS. 2(a) and 2(b), with respect to the total length L, width W and height H of the modular data center, there is no particular limitation in the length L and height H in the typical example but it is desirable in the typical example that the width W is limited to a width sufficient for two rows of server racks 3. It is, however, a matter of course that the configuration is not limited to such an example. Incidentally, the server racks 3 are racks on which server devices 4 as one example of heating elements are mounted.

Although the server devices 4 are a typical example of heating elements, they are not limited to this example. The heating elements may be some electronic devices etc. Although the server racks 3 are a typical example of "racks on which heating elements are mounted", they are not limited to this example. For example, each of the sever racks 3 is substantially shaped like a rectangular parallelepiped but they are not limited to this example. Basically, a plurality of server racks 3 are disposed in rows in a predetermined direction (rows of server racks are formed).

A basic configuration example of the air conditioning system utilizing outdoor air according to this embodiment will be described below with reference to FIGS. 1(a) and 1(b) and FIGS. 2(a) and 2(b). In FIGS. 1(a) and 1(b), a flow of air is represented by one-dot chain line arrows.

As described above, first, two rows of server racks are provided in the typical example shown in FIGS. 2(a) and 2(b). It may be conceived that FIGS. 1(a) and 1(b) show a basic configuration example of an air conditioning system utilizing outdoor air concerned with any one (left in the drawings) of the two rows.

That is, FIG. 1(b) shows a server rack row having four server racks 3 as an example of the arbitrary server rack row and shows four air conditioning devices 10 provided correspondingly to the four server racks 3. The four air conditioning devices 10 are unitized respectively and the same in configuration. Incidentally, the "air conditioning devices" may be referred to as "air conditioners".

Incidentally, an external wall 2, a partition wall 1, a ceiling 5, a floor 6, etc. shown in FIG. 1(a) or the like are not shown in FIG. 1(b).

The four air conditioning devices 10 are disposed in the vicinity of corresponding server racks 3, respectively. Particularly, the four air conditioning devices 10 are disposed so that cold air supplying faces (which will be described later) thereof face air inlet faces (which will be described later) of the corresponding server racks 3, respectively. As shown in the drawing, the four air conditioning devices 10 are disposed in a row in a predetermined direction (particularly in a direction along the partition wall 1) to form an air conditioning device row. The air conditioning device row is a row substantially parallel to the server rack row. In other words, each of the air conditioning device row and the server rack row is a row substantially parallel to the partition wall 1 which will be described later.

In this embodiment, each air conditioning device 10 is an indirect outdoor air cooler which cools indoor air (return air (warm air) from the server racks 3; hereinafter referred to as return air) by using outdoor air without making the outdoor air flow indoors (in a building/modular data center). The cooled indoor air (cold air) is fed to the server racks 3 and cools the server devices 4 mounted in the server racks 3, thereby increasing temperature and forming warm air. Because the server devices 4 are heating elements while they are operating, it is necessary to cool the server devices 4.

There may be the case where the air conditioning devices 10 are not limited to the aforementioned example and are direct outdoor air cooling devices though they are not particularly shown in the drawings. That is, there may be a configuration in which outdoor air is made to flow into the server room so that heating elements such as the server devices 4 are cooled by the outdoor air directly.

Figure 1:
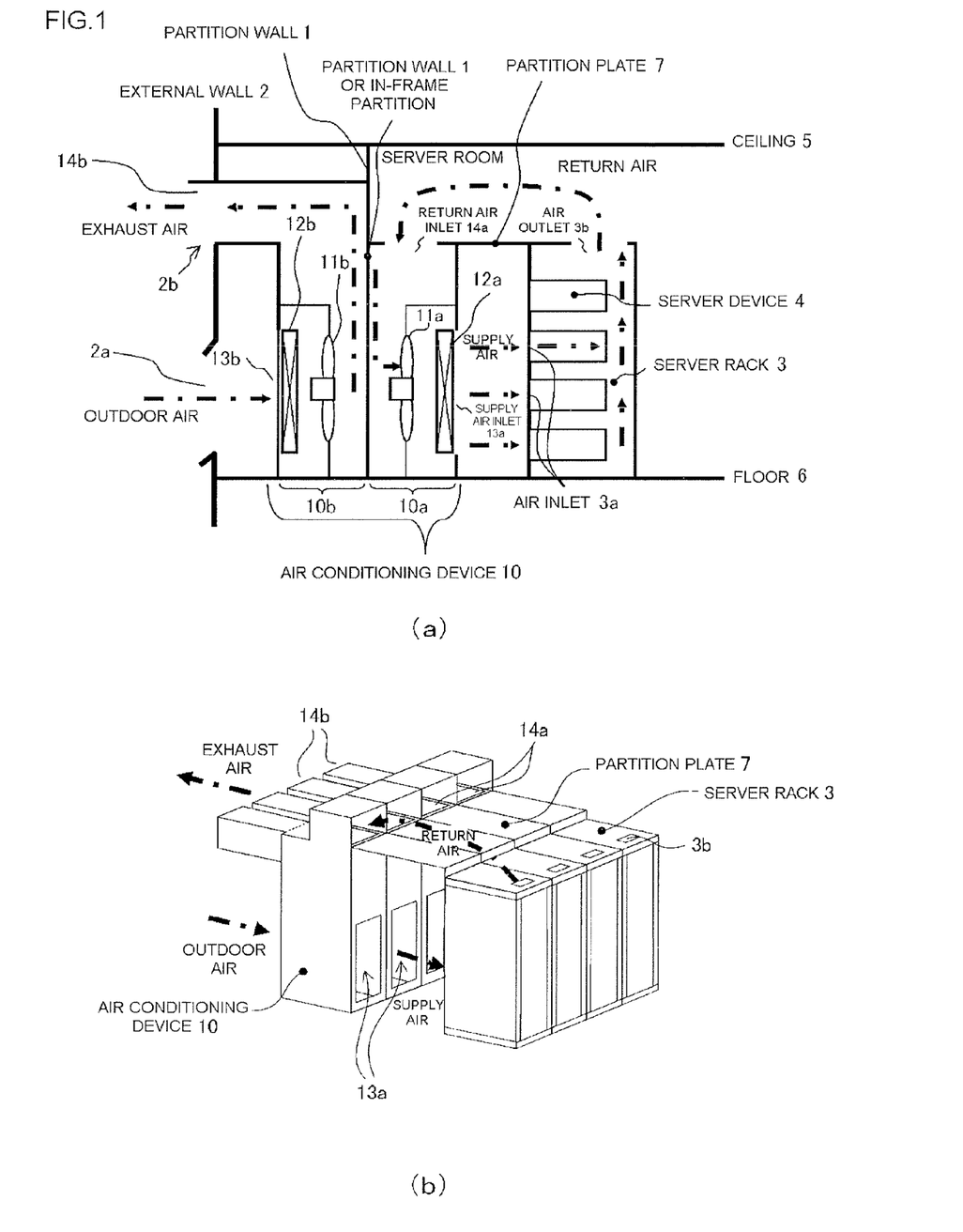
FIGS. 1(a) and 1(b) are basic configuration views of an air conditioning system utilizing outdoor air according to this embodiment.

For example, FIG. 1(*a*) may be regarded as a sectional view of any one of the server racks 3 in FIG. 1(*b*) and an air conditioning device 10 corresponding to the server rack 3.

Each air conditioning device 10 is disposed along the partition wall 1. For example, as described later, it is disposed so that the partition wall 1 is put between two units 10*a* and 10*b*. Consequently, the air conditioning device row is provided as a row substantially parallel to the partition wall 1 as described above.

As shown in FIG. 1(*a*), the air conditioning device 10 can be separated into an indoor side unit (referred to as interior unit 10*a*) and an outdoor side unit (referred to as exterior unit 10*b*), and the partition wall 1 is put therebetween. The interior unit 10*a* is provided in a space (server room) where the server rack 3 is disposed. On the other hand, the exterior unit 10*b* is disposed in a space outside the server room and between the partition wall 1 and the external wall 2. Incidentally, a part of the configuration is not shown in FIG. 1(*a*) but a detailed configuration example will be described later with reference to FIG. 3.

Incidentally, the server room shown here means a space surrounded by the partition wall 1, the ceiling 5 and the floor 6. Incidentally, the partition wall 1 is provided not only as a partition wall 1 disposed in the left of the server racks 3 in the drawing but also as a not-shown partition wall 1 disposed in the right of the server racks 3. Accordingly, it may be said that the partition wall 1 forms the server room (indoor space to be cooled). It may be also said that the partition wall 1 insulates the server room from outdoor air because the outdoor air can be present outside the partition wall 1.

The partition wall 1 and the external wall 2 will be described here with reference to FIGS. 2(*a*) and 2(*b*).

As described above, FIGS. 2(*a*) and 2(*b*) are perspective views showing a warehouse type modular data center in which FIG. 2(*a*) is an outline view and FIG. 2(*b*) is a transparent view.

The warehouse type modular data center shown in the drawings is a substantially rectangular parallelepiped having "length L×width W×height H" as shown in the drawings and regarded as five stories with respect to the height H. As shown in the drawings, the server racks 3 and the air conditioning devices 10 are disposed in rows in the stories respectively.

Figure 2:
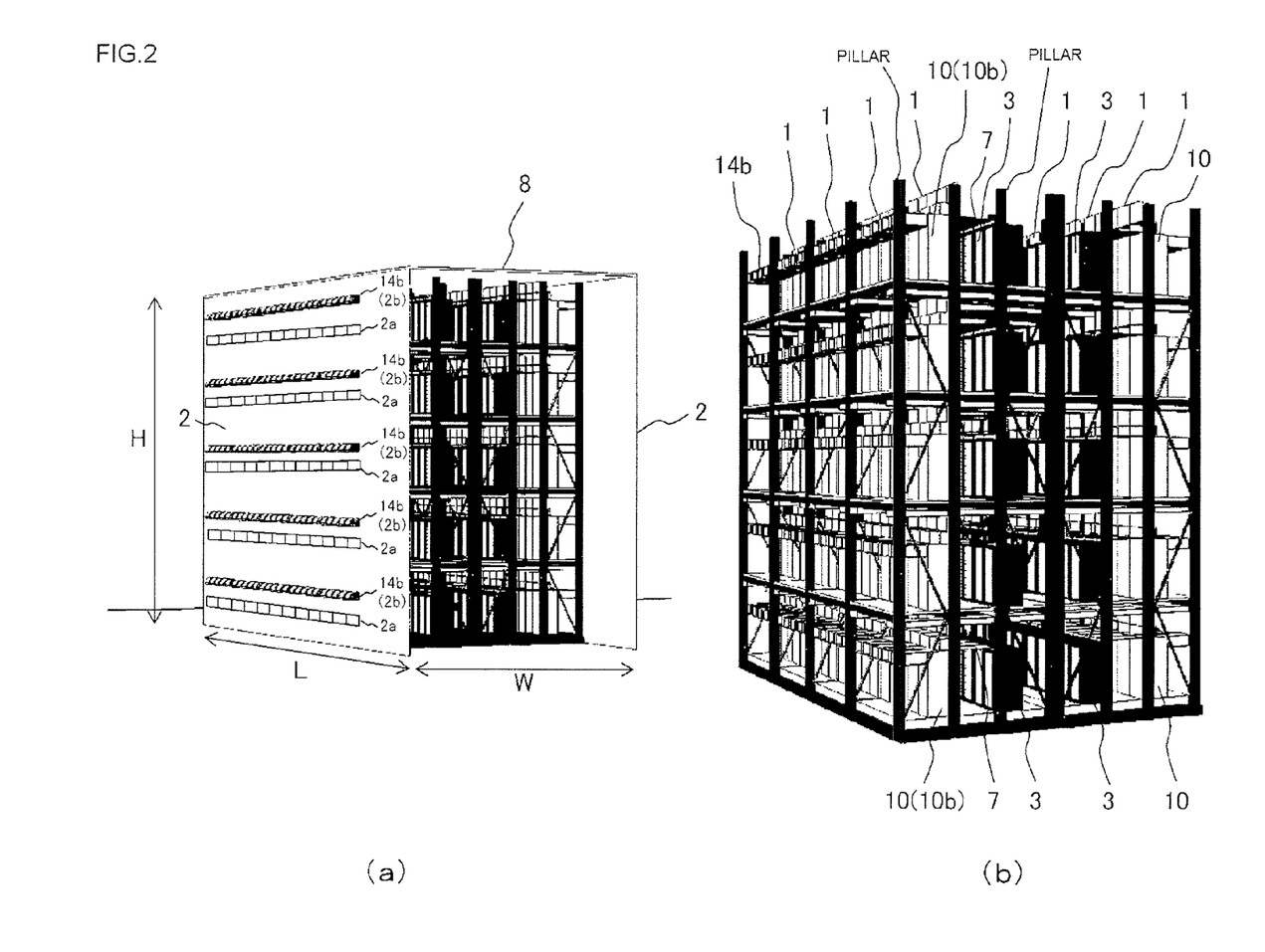
FIGS. 2(a) and 2(b) are a specific example of a data center to which the air conditioning system utilizing outdoor air according to this embodiment is applied.

The laterally external wall 2 (width W) is not shown in FIG. 2(*a*). Though it is not shown in the drawings, as one example, the laterally external wall 2 has neither outdoor air inlet hole 2*a* nor outdoor air outlet hole 2*b* which will be described later. Accordingly, outdoor air does not flow into the inside of the laterally external wall 2. In other words, with respect to the lateral direction, the external wall 2 plays a role of the partition wall 1.

Neither laterally external wall 2 (width W) nor longitudinally external wall 2 (length L) is shown in FIG. 2(*b*), and a ceiling wall 8 is not shown either (accordingly, FIG. 2(*b*) may be regarded as a transparent view). Incidentally, among respective faces of the substantially rectangular parallelepiped, lateral faces may be referred to as front faces and longitudinal faces may be referred to as side faces. Although the front faces and side faces of the substantially rectangular parallelepiped are covered with the external wall 2, the front external wall 2 (being present actually) is not shown in FIG. 2(*a*).

As shown in FIG. 2(*b*), the partition wall 1 is provided inside (inward by one pillar in the example shown in the drawing) the external wall 2. Configuration is made so that outdoor air may flow into a space between the external wall 2 and the partition wall 1 but outdoor air does not flow into a space (server room) inside the partition wall 1.

As shown in FIG. 2(*a*), outdoor air inlet holes 2*a* and outdoor air outlet holes 2*b* in accordance with respective air conditioning devices 10 are formed in the external wall 2 of the side faces.

As shown in FIG. 1(*a*), the exterior unit 10*b* has a first fan 11*b* and a first heat exchanger 12*b*. An outdoor air inlet 13*b* and an outdoor air outlet 14*b* are provided in the housing of the exterior unit 10*b*. As shown in the drawing, the outdoor air outlet 14*b* protrudes outward while passing through the outdoor air outlet hole 2*b*.

After outdoor air is made to flow into the housing from the outdoor air inlet 13*b* and pass through the first heat exchanger 12*b* by the first fan 11*b*, the outdoor air is ejected from the outdoor air outlet 14*b*. These are formed as flows of air (outdoor air) represented by one-dot chain line arrows in the drawing. For example, the outdoor air inlet 13*b* is provided in a position facing the outdoor air inlet hole 2*a* of the external wall 2 as shown in the drawing. In this manner, outdoor air flowing in from the outdoor air inlet hole 2*a* flows into the housing of the exterior unit 10*b* from the outdoor air inlet 13*b* directly.

While the outdoor air taken in from the outdoor air inlet 13*b* passes through the first heat exchanger 12*b*, the heat exchange is performed between the outdoor air and a refrigerant (cold water or the like) which will be described later. In this embodiment, the case where cold water is used as an example of the refrigerant will be described below. When the temperature of outdoor air is lower than the temperature of cold water, the cold water is cooled by the outdoor air in the first heat exchanger 12*b*.

In this manner, the exterior unit 10*b* takes in outdoor air through the outdoor air inlet hole 2*a* and the outdoor air inlet 13*b*, heat exchanges by the first heat exchanger 12*b*, and then ejects the outdoor air from the outdoor air outlet 14*b*.

For example, the exterior unit 10*b* is disposed so that one face of the housing of the exterior unit 10*b* is disposed closely to (the outdoor side face of) the partition wall 1 as shown in the drawing. The interior unit 10*a* is also disposed so that one face (referred to as rear face) of the housing of the interior unit 10*a* is disposed closely to (the indoor side face of) the partition wall 1.

Incidentally, the air conditioning device 10 is not limited to the aforementioned example. For example, the air conditioning device 10 may be configured as an integral type unit in which the exterior unit 10*b* and the interior unit 10*a* are not separated. In this case, for example, a hole having a size substantially equal to that of the interior unit is provided in each place of the partition wall 1, so that the interior unit of the integral type unit can be inserted in the hole (e.g. from the outdoor side) to dispose the air conditioning device 10 substantially in the same state as in FIG. 1(*a*).

Incidentally, in this case, with respect to the portion where the integral type unit is disposed, the partition wall 1 shown in FIG. 1(*a*) is not provided between the exterior unit 10*b* and the interior unit 10*a* (but the "hole" is provided). Instead, an "in-frame partition", not shown in the drawings, for partitioning the integral type unit into the exterior unit and the interior unit is provided in advance when the integral type unit is produced in a factory or the like.

From the above description, as shown in FIG. 1(*a*), the "partition wall 1 or in-frame partition" is provided between the exterior unit 10*b* and the interior unit 10*a*.

Although configuration is not limited to the aforementioned configuration example, it is necessary that configuration is made to prevent outdoor air from flowing into the interior unit 10a and the server room.

The interior unit 10a will be described below.

In the example shown in FIG. 1(a), the interior unit 10a has a second fan 11a and a second heat exchanger 12a. An air supply inlet 13a and a return air inlet 14a are provided in the housing of the interior unit 10a. In the example shown in the drawing, the return air inlet 14a is provided in an upper face of the housing of the interior unit 10a and the air supply inlet 13a is provided in a front face (air supply face) thereof. However, the configuration is not limited to this example. Incidentally, as described above, it is necessary to provide the interior unit 10a so that the air supply face (air supply inlet 13a) faces the air inlet face (air inlet 3a which will be described later) of the server rack 3.

A flow of indoor air of the server room passes through the interior unit 10a is formed by the second fan 11a. That is, there is formed such a flow of indoor air that return air from the server rack 3 flows into the interior unit 10a from the return air inlet 14a and passes through the second heat exchanger 12a, so that the air is fed out as cold air from the air supply inlet 13a.

Here, the first heat exchanger 12b and the second heat exchanger 12a are connected to a piping not shown in the drawings, so that the refrigerant (cold water is taken as an example here) circulates in the first and second heat exchangers 12b and 12a through the piping. Consequently, the heat exchange between the cold water and the outdoor air is performed in the first heat exchanger 12b as described above. Similarly, the heat exchange between the cold water and the return air is performed in the second heat exchanger 12a. This means that the heat exchange between the outdoor air and the return air is performed indirectly through cold water so that the return air is basically cooled by the outdoor air to generate cold air.

As described above, the cold water is basically cooled by the outdoor air in the first heat exchanger 12b so that the cooled cold water is fed to the second heat exchanger 12a. Consequently, the return air is basically cooled by the cold water in the second heat exchanger 12a, thereby generating cold air. The generated cold air is fed from the air supply inlet 13a.

Here, as shown in FIG. 1(a), the interior unit 10a is provided in the vicinity of the server rack 3 and disposed so that the air supply face (face in which the air supply inlet 13a is provided) faces the air inlet face (face in which the air inlet 3a is provided) of the server rack 3. An air outlet 3b is provided in an upper face (top face) on the rear side of the server rack 3. However, configuration is not limited to this example. The air outlet 3b may be provided in the rear face of the server rack 3. Incidentally, assume here that the air supply face is regarded as the front face, and a face on the opposite side (rear side face) is regarded as the rear face.

For example, a fan not shown in the drawings is provided in the server rack 3. Air (cold air) is sucked in from the air inlet 3a by the fan. After the air passes through each server device 4 mounted in the server rack 3, the air is ejected from the air outlet 3b. The cold air passes through the server device 4 as a heating element, thereby cooling the server device 4 and increasing the temperature, so that the air is ejected as warm air from the air outlet 3b.

Here, for example, by forming overall configuration as the configuration shown in FIGS. 2(a) and 2(b), rows of server racks 3 can be formed along partition walls 1 in the vicinity of the partition walls 1. Because two side faces are provided, two partition walls 1 are provided. When a server rack row is formed along each partition wall 1 in accordance with the partition wall 1, the number of the rows of the server rack is two as described above. Because the air conditioning devices 10 are disposed so that each partition wall 1 is put between the air conditioning devices 10 as described above, the row of the air conditioning device is formed along each partition wall 1 in accordance with each partition wall 1. Accordingly, in the aforementioned example, the number of the rows of the air conditioning device is two. In accordance with each partition wall 1, the server rack row and the row of the air conditioning device are substantially parallel to each other as described above.

For example, as in the example shown in FIG. 1(a), 1(b), one air conditioning device 10 corresponding to one server rack can be disposed in the vicinity of the server rack 3. As described above, installation can be made so that the cold air supply face of each air conditioning device 10 faces the cold air inlet face of the server rack 3.

By the aforementioned configuration, the distance between each server rack 3 and an air conditioning device 10 corresponding to the server rack 3 becomes very short and it is easy to supply cold air compared with the background art. That is, because cold air fed out from the air supply inlet 13a of the interior unit 10a flows substantially directly into the air inlet 3a of the air inlet face of the opposite server rack 3 without interposition of ducts, underfloor spaces, etc., low pressure loss and high efficiency (air supply efficiency, etc.) can be attained.

Because the distance between each server rack 3 and an air conditioning device 10 corresponding to the server rack 3 becomes very short compared with the background art, low pressure loss and high efficiency can be attained with respect to collection of return air. That is, return air ejected from the server rack 3 can be made to flow into the return air inlet 14a of the air conditioning device 10 substantially directly without interposition of ducts, roof spaces, etc.

With respect to suction and discharge of outdoor air, the exterior unit 10b of each air conditioning device 10 is disposed in the vicinity of the external wall 2 so as to be located in a place near the outdoor air space (outside the external wall 2). Accordingly, ducts for suction and discharge of outdoor air are not required or even if the ducts are required, the ducts are very short. Accordingly, with respect to suction and discharge of outdoor air, low pressure loss and high efficiency can be attained.

As described above, in any one of outdoor air, cold air and return air, the distance of the air flows is very short compared with the background art so that a ductless configuration can be substantially achieved, and it may be said that this configuration is a low pressure loss and high efficiency configuration. In this manner, by unitizing air conditioning devices and providing them without duct, the space of installation is reduced and the cost of installation is reduced so that the flexibility of installation becomes high.

With respect to the flexibility of installation, for example, the maximum capacity of the server racks 3 is not always installed initially in the warehouse type modular data center shown in FIG. 2, so that a free space may be often provided. Configuration is made so that the air conditioning devices 10 are not disposed in such a free space. Whenever a server rack 3 is then provided additionally, a new air conditioning device 10 corresponding to the newly disposed server rack 3 is provided additionally. Because the air conditioning devices 10 are unitized and provided without duct, the work of the additional provision on this occasion is so easy that the work load/cost can be reduced.

Incidentally, with respect to the above description "the air conditioning device 10 (interior unit 10a) is provided in the vicinity of the server rack 3", the specific numerical value of the "vicinity" is not indicated. That is, the distance between the interior unit 10*a* and the server rack 3 is not needed to be defined particularly. However, as an example, such a distance (width) that a human can pass easily, may be provided so that maintenance of the server devices 4 or the like can be possible. In any case, as shown in FIG. 1 or the like, the distance between the cold air feed port (air supply inlet 13*a*) of the air conditioning device 10 or the like and (the air inlet face of) the server rack 3 becomes very short compared with the background-art example.

Here, the cold air flowing into the server rack 3 through the air inlet 3*a* as described above passes through the respective server devices 4 to thereby cool the server devices 4. Accordingly, the temperature of air is increased so that the air is ejected as warm air from the air outlet 3*b*. Although the warm air is sucked into the return air inlet 14*a* of the interior unit 10*a* as described above, there is, however, a possibility that part of the warm air will flow into a space (space where cold air is supplied from the air supply inlet 13*a*; referred to as cold space) between the interior unit 10*a* and the server rack and will be mixed with the cold air to increase the temperature of the cold air.

To prevent such a situation, in this embodiment, a partition plate 7 is provided (in an upper portion) between the interior unit 10*a* and the server rack 3 as shown in FIGS. 1(*a*) and 1(*b*). In the example shown in the drawings, the partition plate 7 is disposed so that one end of the partition plate 7 is connected to the upper portion of the interior unit 10*a*, and the other end of the partition plate 7 is connected to the upper face (top face) of the server rack 3. In this manner, return air ejected from the air outlet 3*b* of the server rack 3 passes above the partition plate 7 and flows into the return air inlet 14*a* of the interior unit 10*a*. When the return air passes above the cold space, the return air does not flow (into the cold space) below the partition plate 7 because of the presence of the partition plate 7 (even if the return air flows into the cold space, the amount of the return air is small). In this manner, the provision of the partition plate 7 can prevent such a situation that warm air and cold air are mixed with each other (even if they are mixed, the amount of mixture is small).

As described above, the provision of the partition plate 7 can separate cold air and warm air to prevent the both from being mixed with each other. Incidentally, because the interior unit 10*a* is provided in the vicinity of the server rack 3, the length of the partition plate 7 can be reduced so that the cost of the partition plate 7 can be reduced and the partition plate 7 can be disposed easily.

Incidentally, the aforementioned configuration is only one example and it is not limited. For example, in the aforementioned example, air conditioning devices 10 are provided correspondingly to the server racks 3 respectively. That is, when M server racks 3 are provided, M air conditioning devices 10 (M: an arbitrary integer) are provided. However, without limitation to this example, for example, when M server racks 3 are provided, the number of air conditioning devices 10 may be M/2, M/3 or the like. In other words, one air conditioning device 10 may be provided correspondingly to two server racks 3 or one air conditioning device 10 may be provided correspondingly to three server racks 3.

In the configuration in which one air conditioning device (air conditioner) 10 is provided for each server rack, for example, it is desirable that the horizontal width of the air conditioning device 10 is substantially equal to the horizontal width of the server rack 3. Similarly, in the configuration in which one air conditioning device 10 is provided for every two server racks 3 or one air conditioning device 10 is provided for every three server racks 3, for example, it is desirable that the horizontal width of the air conditioning device 10 is an integer multiple (twice or three times) of the horizontal width of the server rack 3. That is, in a viewpoint of supplying cold air efficiently and reducing the deviation of cold air supply, it is desirable that the horizontal width of the air conditioning device 10 is substantially equal to the total horizontal width of one or more server racks 3 handled (cooled) by the air conditioning device 10.

Figure 3:
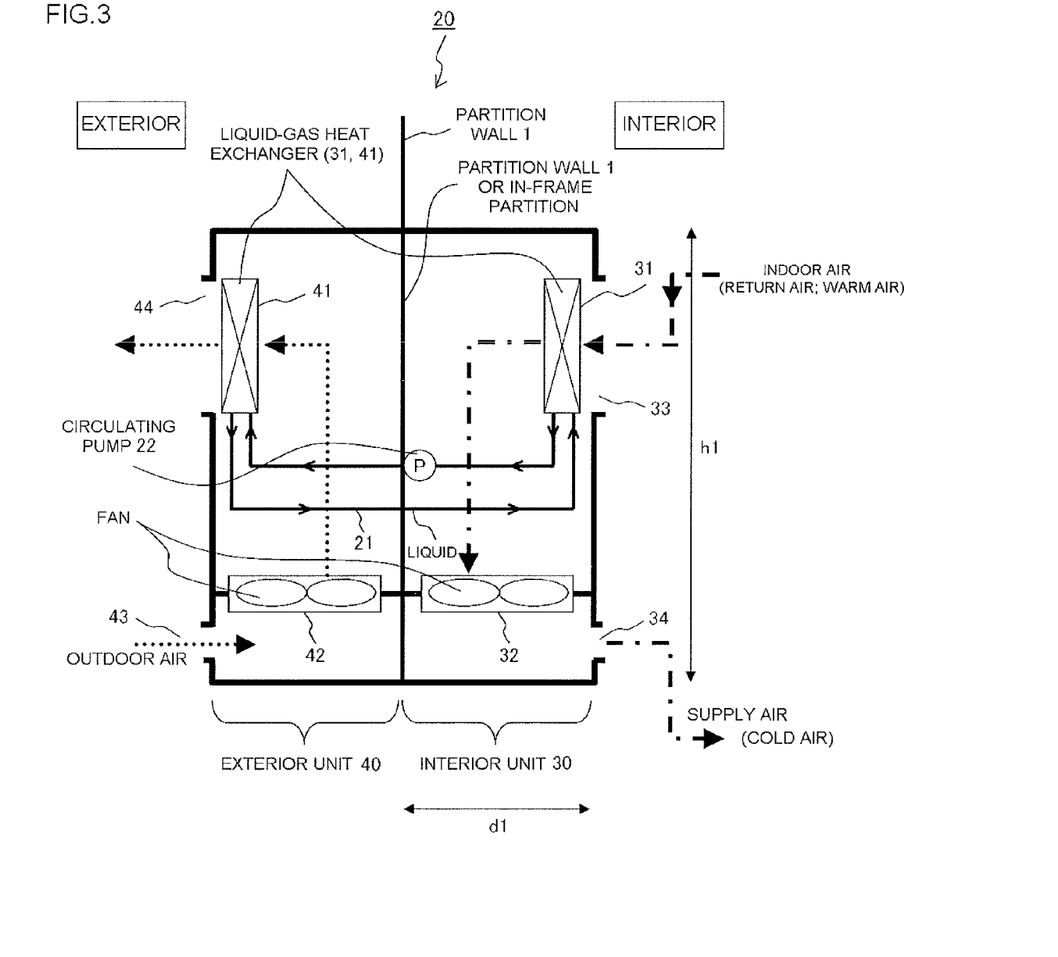
FIG. 3 is a view showing a detailed basic configuration example of an air conditioning device.

Here, a more detailed configuration example of the air conditioning device is shown in FIG. 3. This shows a more detailed configuration example of the air conditioning device as an indirect outdoor air cooler.

The indirect outdoor air cooler 20 shown in the drawing has an interior unit 30 and an exterior unit 40. As described above, the air conditioning device 10 in FIGS. 1(*a*), 1(*b*), 2(*a*) and 2(*b*) has an interior unit 10*a* and an exterior unit 10*b* as an example. Configuration examples corresponding to the interior unit 10*a* and the exterior unit 10*b* are the interior unit 30 and the exterior unit 40 in FIG. 3.

Accordingly, the interior unit 30 and the exterior unit 40 may be produced as separate units in the same manner as in the aforementioned case of the interior unit 10*a* and the exterior unit 10*b* or may be produced as an integral type unit. Since this has been described already, this description will be given simply here. That is, in the case of the separate unit configuration, the interior unit 30 and the exterior unit 40 are disposed so that the interior unit 30 is disposed closely to the indoor side wall face of the partition wall 1 and the exterior unit 40 is disposed closely to the outdoor side wall face of the partition wall 1. On the other hand, in the case of the integral type unit configuration, an "in-frame partition" is provided between the interior unit 30 and the exterior unit 40 in advance at the time of production. A hole is provided in the partition wall 1, so that the integral type unit is inserted in this hole and disposed. Incidentally, in the following description, the case where the interior unit 30 and the exterior unit 40 are produced as separate units will be used as an example.

In a state where installation is completed, for example, the interior unit 30 has a liquid-gas heat exchanger 31, a fan 32, a piping 21 (part thereof; about a half), a circulating pump 22, etc. as shown in the drawing.

In a state where installation is completed, for example, the exterior unit 40 has a liquid-gas heat exchanger 41, a fan 42, a piping 21 (part thereof; about a half), etc. as shown in the drawing.

Incidentally, the circulating pump 22 is not limited to the aforementioned example in which the circulating pump 22 is provided on the interior unit 30 side, but the circulating pump 22 may be provided on the exterior unit 40 side.

The piping 21 is connected to the liquid-gas heat exchanger 31 and the liquid-gas heat exchanger 41. The circulating pump 22 is provided on the piping 21. A refrigerant (e.g. water; cold water) always circulates in the liquid-gas heat exchanger 31 and the liquid-gas heat exchanger 41 through the piping 21 during operation. The power source of the liquid circulation is the circulating pump 22. Accordingly, the circulating pump 22 may be stopped when it is necessary to stop the circulation of the refrigerant.

Indoor air (return air; warm air) passes through the liquid-gas heat exchanger 31 whereas outdoor air passes through the liquid-gas heat exchanger 41. Consequently, the heat exchange between the indoor air and the cold water is performed in the liquid-gas heat exchanger 31 whereas the heat exchange between the outdoor air and the cold water is performed in the liquid-gas heat exchanger 41. Basically, the indoor air (warm air) is cooled by the cold water to thereby generate cold air, and the cold water, the temperature of which increases as a result, is cooled by the outdoor air.

When the interior unit 30 is produced in a factory or the like, the liquid-gas heat exchanger 31, the fan 32, etc. shown in the drawing are provided in a box type housing, for example, having one face opened. Holes (an indoor air inlet 33 and an indoor air outlet 34) shown in the drawing are formed in the housing of the interior unit 30.

It is made so that the liquid-gas heat exchanger 31, the fan 32, the indoor air inlet 33 and the indoor air outlet 34 are equivalent to the second heat exchanger 12a, the second fan 11a, the return air inlet 14a and the air supply inlet 13a in FIG. 1(a), respectively. Accordingly, for example, the position of the indoor air inlet 33 is not limited to the position shown in the drawing, but the indoor air inlet 33 may be provided in the upper face of the housing like the return air inlet 14a. The positions where the liquid-gas heat exchanger 31 and the fan 32 are disposed, are not limited to the positions shown in the drawing, but, for example, the liquid-gas heat exchanger 31 and the fan 32 may be disposed in the positions of the second heat exchanger 12a and the second fan 11a in FIG. 1(a) or may be disposed in any other positions.

Substantially similarly to the interior unit 30, when the exterior unit 40 is produced in a factory or the like, the liquid-gas heat exchanger 41, the fan 42, etc. shown in the drawing are provided in a box type housing, for example, having one face opened. Holes (an outdoor air inlet 43 and an outdoor air outlet 44) shown in the drawing are formed in the housing of the exterior unit 40.

It is made so the fan 42, the liquid-gas heat exchanger 41, the outdoor air inlet 43 and the outdoor air outlet 44 are equivalent to the first fan 11b, the first heat exchanger 12b, the outdoor air inlet 13b and the outdoor air outlet 14b in FIG. 1(a), respectively. Accordingly, for example, the shape of the housing of the exterior unit 40 is not limited to the shape shown in the drawing, but, for example, the shape of the housing of the exterior unit 40 may be the shape of the housing of the exterior unit 10b etc. or may be any other shape. The positions where the liquid-gas heat exchanger 41 and the fan 42 are disposed are not limited to the positions shown in the drawing, but, for example, the liquid-gas heat exchanger 41 and the fan 42 may be disposed in the positions of the first heat exchanger 12b and the first fan 11b in FIG. 1(a) or may be disposed in any other positions.

Incidentally, each of the interior unit 30 and the exterior unit 40 is disposed so that its opened face is aligned with the wall face of the partition wall 1.

The piping 21 and the circulating pump 22 are further provided at the time of installation. On this occasion, it is necessary to form one or more through-holes (basically, two through-holes) for inserting the piping 21 in the partition wall 1 (it is a matter of course that the through-holes may be formed in places of the wall face 1 in advance but the through-holes in the places where indirect outdoor air coolers 20 have been not disposed yet, need to be blocked by some method). When the piping 21 (part thereof; about a half) has already been provided in each of the interior unit 30 and the exterior unit 40 at the time of production at a factory, the piping 21 may be welded to each other (the circulating pump 22 is also connected on this occasion) so that "the piping 21 provided with the circulating pump 22 in the middle" shown in the drawing is formed.

By disposing the interior unit 30 and the exterior unit 40 in the aforementioned manner, the indirect outdoor air cooler 20 is formed.

In the indirect outdoor air cooler 20, because heat exchange is performed while outdoor air and indoor air are insulated from each other so that outdoor air moisture, dust and corrosive gas contained in the outdoor air can be prevented from being taken in the server room, reliability of electronic devices such as servers can be kept.

Incidentally, the description "partition wall 1 or in-frame partition" between the interior unit 30 and the exterior unit 40 in FIG. 3 is made for the same reason as the description "partition wall 1 or in-frame partition" in FIG. 1(a). That is, the indirect outdoor air cooler 20 may be formed as an integral type configuration in which the interior unit 30 and the exterior unit 40 are integrated with each other. In this case, a partition for separating the inside into the interior unit 30 and the exterior unit 40 is provided. The piping 21 is pierced in the partition (the circulating pump 22 has been already provided). The indirect outdoor air cooler 20 having the configuration is produced in a factory or the like in advance.

If the housing of the interior unit 30 has a horizontal width of w1, a height of h1 and a depth of d1, holes having a size of w1×h1 are provided in respective places of the partition wall 1 in advance (but blocked with plates or the like at the time of uninstallation). At the time of installation of the indirect outdoor air cooler 20, the indirect outdoor air cooler 20 can be installed in such a manner that the interior unit 30 of the indirect outdoor air cooler 20 is inserted in one of the holes, for example, from the outdoor side or the like so as to be brought into the state shown in FIG. 3. Accordingly, since it is unnecessary to form the through-holes in the partition wall 1 for the piping 21 in this case, it is unnecessary to perform the work of inserting the piping 21 in the through-holes so that the work of installation can be performed more easily.

Incidentally, as a modification, for example, in the air conditioning device 10 or the indirect outdoor air cooler 20, an air conditioning device configuration using general refrigerating cycle such as vapor compression refrigerating cycle may be further provided in addition to the configuration (referred to as outdoor air utilization cooling device) in which the outdoor air is utilized so that return air is cooled by heat exchange.

Because the cooling capacity of the outdoor air utilization cooling device depends on the temperature of outdoor air or the like, there is a possibility that the inside temperature of the server room cannot be kept at a preset temperature (the cooling capacity will be insufficient). For this reason, there is heretofore a case where an air conditioning device using general refrigerating cycle is further provided. In this case, even if there is a situation (because of the high temperature of outdoor air or the like) that the temperature of the return air cannot be reduced to the preset temperature by utilization of outdoor air, return air is made to flow into the general air conditioning device after the temperature of the return air is reduced to some degree. Accordingly, the cooling load on the general air conditioning device can be reduced so that an energy saving effect can be obtained.

In this modification, the configuration of such a general air conditioning device is provided in the housing of the air conditioning device 10 or the indirect outdoor air cooler 20.

Although a configuration example of such a modification is not particularly shown in the drawings, it is well-known that, for example, an air conditioning device using vapor compression refrigerating cycle has constituent elements such as an evaporator, a compressor, a condenser and an expansion valve and is configured so that a refrigerant circulates in these constituent elements through a refrigerant pipe. Configuration may be made so that these constituent elements and the refrigerant pipe are provided in the housing of the air conditioning device 10 or the indirect outdoor air cooler 20.

Here, the air conditioning device 10 or the indirect outdoor air cooler 20 is composed of an interior unit and an exterior unit. The evaporator is provided in the interior unit whereas the condenser is provided in the exterior unit. The compressor and the expansion valve may be provided in either of the interior unit and the exterior unit.

It is desirable that the evaporator is provided on the downstream side of a heat exchanger (e.g. the second heat exchanger 12a). Here, the upstream side/downstream side means the upstream side/downstream side concerned with a flow of air. Because the evaporator is disposed in the interior unit, this means the upstream side/downstream side concerned with a flow of air (indoor air; return air, cooled air, etc.) passing through the inside of the interior unit.

By providing the evaporator on the downstream side of the heat exchanger as described above, return air can be first cooled by the heat exchanger and then cooled to the preset temperature by the evaporator.

Although it is conceived as an example that the condenser is provided on the downstream side (downstream side in a flow of outdoor air) of a heat exchanger (e.g. the first heat exchanger 12b) in the exterior unit, configuration is not limited to this example.

Although the example shown in FIGS. 2(a) and 2(b) is configured so that each rack row is provided substantially in parallel to (the partition wall 1 substantially parallel to) the longitudinally external wall 2 of a building substantially shaped like a rectangular parallelepiped and, accordingly, two rack rows are provided; the configuration is not limited to this example. For example, each rack row may be further provided substantially in parallel to (the partition wall 1 substantially parallel to) the laterally external wall 2 of the building substantially shaped like a rectangular parallelepiped and, accordingly, two rows of rack may be further formed so that four rows of rack are formed in total. Incidentally, in this case, it is a matter of course that the holes 2a and 2b need to be provided also in the laterally external wall 2, and that the partition wall 1 needs to be provided also in the lateral face (front face).

In any case, the air conditioning device according to this embodiment utilizes outdoor air and requires suction and discharge of the outdoor air. Accordingly, to achieve this substantially without duct, it is necessary that the air conditioning device can be disposed near the outdoor air environment (near the external wall 2). Moreover, to perform supply of cold air to heating elements and collection of return air efficiently (to achieve this without duct), it is necessary that the air conditioning device can be disposed near the rack mounted with heating elements. Although the configuration of FIGS. 2(a) and 2(b) is a typical example in which installation of such an air conditioning device can be achieved, the configuration is not limited to this example.

According to the aforementioned basic configuration of the air conditioning system utilizing outdoor air according to this embodiment, the following effects can be obtained.

Because the outdoor air opening portion (outdoor air inlet hole 2a) and the outdoor air intake face (outdoor air inlet 13b) of the air conditioning device 10 are disposed opposite to each other (more closely) or/and because the cold air supplying face (air supply inlet 13a) of the air conditioning device 10 and the cold air inlet face (air inlet 3a) of the server rack 3 are disposed opposite to each other (further closely), low pressure loss and high efficiency can be obtained and substantially ductless configuration can be obtained so that the installation space efficiency becomes high, and that underfloor free access for installation or the like is not required.

Because the horizontal width of the air conditioning device 10 is substantially equal to or an integer multiple of the horizontal width of the server rack 3, an air conditioning device 10 can be provided easily correspondingly to each server rack 3 so that air conditioning devices 10 can be additionally provided easily in accordance with additional provision of server racks 3.

Because the partition plate 7 or the like separates warm air and cold air from each other, the system ceiling is not required.

Because duct construction work is not required (at least long duct construction work as in the background art is not required), the work of installation can be performed easily, the cost of installation can be reduced and flexible installation can be performed.

Because the air conditioning device 10 is unitized so that an independent cooling device in accordance with each unit can be provided, a cool-heat infrastructure is not required so that installation can be performed easily.

Figure 4:
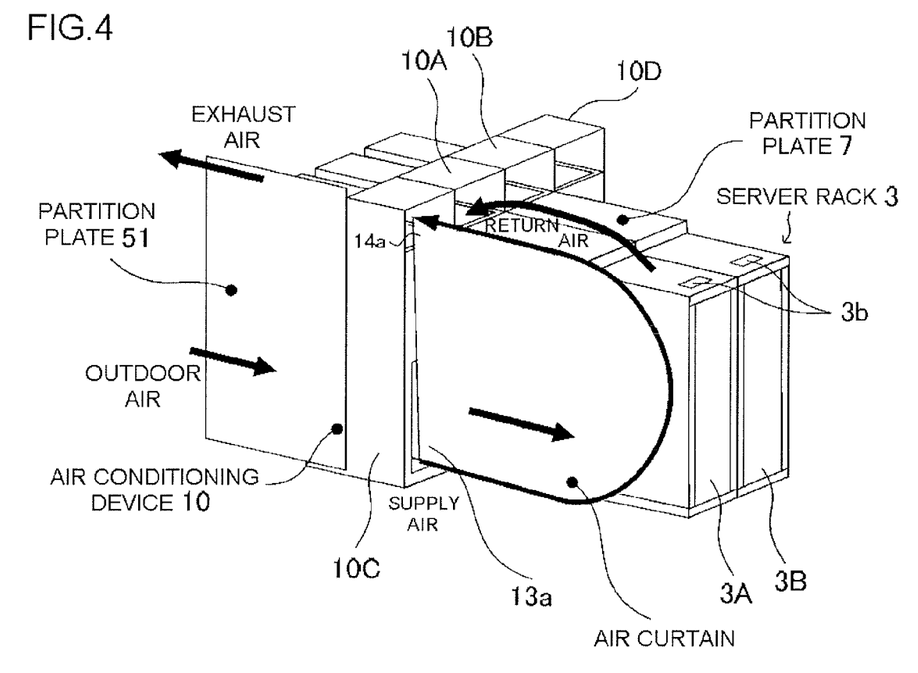
FIG. 4 is a configuration view (perspective view) of the air conditioning system utilizing outdoor air based on the basic configuration.
Figure 5:
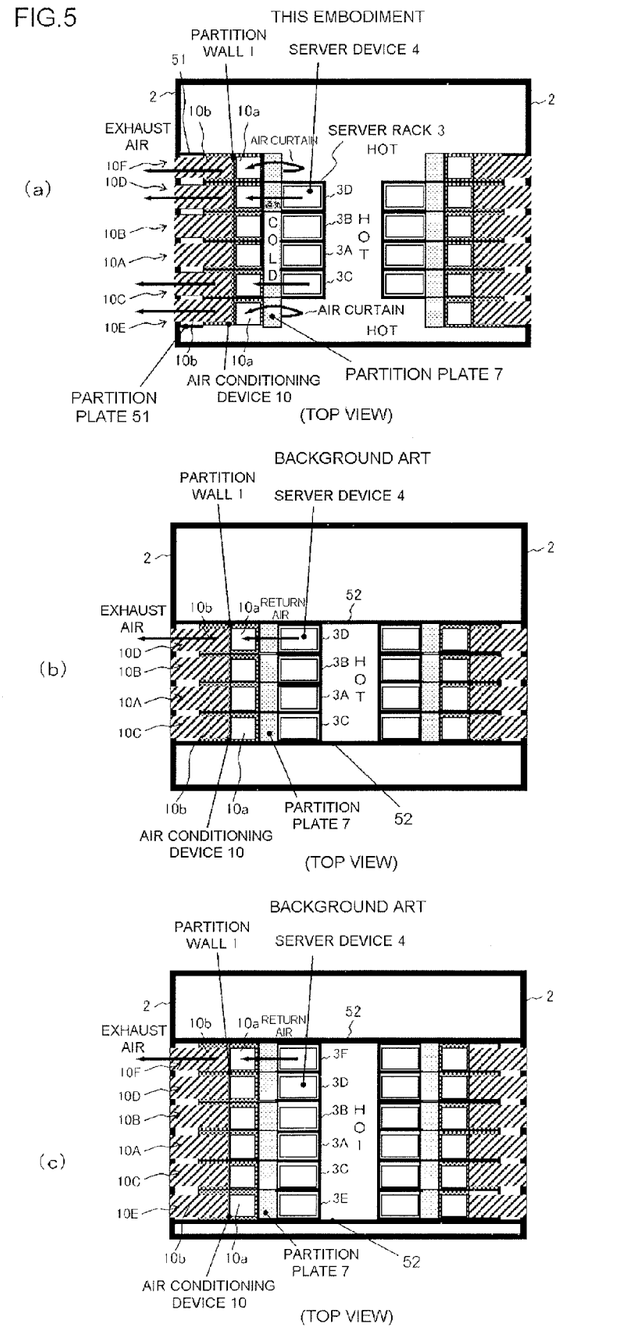
FIG. 5(a) is a top view of the air conditioning system utilizing outdoor air according to this embodiment.
FIGS. 5(b) and 5(c) are top views showing the case where a background-art method is applied.

FIG. 4 is a configuration view (perspective view) of the air conditioning system utilizing outdoor air according to this embodiment based on the aforementioned basic configuration of this embodiment. FIG. 5(a) shows a top view of the air conditioning system utilizing outdoor air according to this embodiment. FIGS. 5(b) and 5(c) further show top views in the case where the background art is applied, for comparison.

First, as described above with reference to FIGS. 1(a) and 1(b), etc., in the air conditioning system utilizing outdoor air according to this embodiment, rows of the air conditioning device, each composed of a plurality of air conditioning devices 10, are formed substantially in parallel to the rows of rack, each composed of a plurality of server racks 3. In the example shown in FIG. 1, one air conditioning device 10 corresponding to one server rack 3 is provided, and the horizontal width of each air conditioning device 10 is set to be substantially equal to the horizontal width of each server rack 3. Accordingly, in this example, the total horizontal width of each air conditioning device row composed of the plurality of air conditioning devices 10 is substantially equal to the total horizontal width of each row of rack composed of the plurality of server racks 3.

Incidentally, this shows a basic configuration. The air conditioning system utilizing outdoor air according to this embodiment is configured so that the total horizontal width of each row of the air conditioning device composed of the plurality of air conditioning devices 10 is larger than the total horizontal width of each row of rack composed of the plurality of server racks 3. Moreover, opposite ends of the air conditioning device row are disposed more outwardly than opposite ends of the row of rack.

This is made, for example, as an example so that air conditioning devices 10 corresponding to server racks 3 respectively in the row of rack are provided and air conditioning devices 10 are further provided at opposite ends of the row of the air conditioning device, as shown in FIGS. 4 and 5(a). That is, the number of air conditioning devices 10 is set to be a number obtained by adding two to the number of server racks 3 (i.e. to be larger by two than the number of server racks 3).

For example, in the example shown in FIG. 4, each row of rack is composed of two server racks 3 (3A and 3B), and air conditioning devices 10 are provided in accordance with the respective server racks 3, thereby forming the row of each air conditioning device composed of two air conditioning devices 10 (two (10A and 10B) in the middle of four air conditioning devices 10 shown in the drawing). In addition, two air conditioning devices 10 (10C and 10D) are disposed at opposite ends of the row of the air conditioning device, respectively.

It can be said that the air conditioning devices 10C and 10D at the opposite ends are air conditioning devices 10 each having no corresponding server rack 3. Therefore, cold air fed out from the air supply inlet 13a is looped as shown in FIG. 4 and returned to the return air inlet 14a, so that an air curtain shown in the drawing is formed. Although FIG. 4 shows only one air conditioning device 10C, it is a matter of course that substantially the same air curtain is formed with respect to the air conditioning device 10D. Here, FIGS. 1(a), 1(b) and 4 typically show the basic configuration in a way easy to understand but do not show actual sizes. For example, although FIG. 4 shows the case where the partition plate 7 is drawn largely compared with the skylight portion of the server rack 3, the partition plate 7 may be actually very short.

Although air (return air) ejected from the air outlet 3b of each server rack 3 basically passes above the partition plate 7 and flows into the return air inlet 14a, part of the air may enter a cold space (space between the air conditioning device row and the server rack row; space where cold air is fed out from the air supply inlet 13a) from a side. A hot space as shown in FIG. 5(a) may be formed later so that warm air in the hot space may enter the cold space. Although the curtain portions made of vinyl chloride sheets, panels or the like are disposed in the background art to prevent this, air curtains are formed by use of the air conditioning devices 10 in this method.

By the aforementioned configuration, return air ejected from the server racks 3 is prevented from intruding into the cold space. That is, intrusion from the top face is blocked by the partition plate 7 whereas intrusion from the side face is blocked by the air curtain.

Incidentally, the air conditioning device 10 which forms an air curtain may be operated in a mode (e.g. a mode in which only air blowing is performed) different from the ordinary mode. When it is operated in a mode in which only air blowing is performed, only the fan of the interior unit is operated. This is a state where the outdoor side fan 42 is stopped, the circulating pump 22 is stopped and only the indoor side fan 32 is operated in the example of FIG. 3. It is a mater of course that the air curtain in this case is not an air curtain due to cold air.

As described later in detail, when server racks 3 are provided additionally here, air conditioning devices 10 are provided additionally in accordance with the additional provision. For example, when two server racks 2 are added to the aforementioned example, two air conditioning devices 10 (10E and 10F which will be described later) are disposed additionally at opposite ends of the rows of the air conditioning device, respectively. These additionally disposed air conditioning devices 10E and 10F form the air curtains.

When the air conditioning devices 10 (10E and 10F) additionally disposed in accordance with the additional provision of the server racks 3 come into a state in which they form the air curtains in the case where the mode in which only air blowing is performed is used; the air conditioning devices (10C and 10D) forming the air curtains before additional provision go back to the ordinary mode. In the ordinary mode, it is a matter of course that the fans 42, the circulating pumps 22 and the fans 32 are operated to feed out cold air to the corresponding server racks 3.

In this manner, because this method uses unit type air conditioning devices 10 (for example, provided superfluously) for forming air curtains, a shortcut between air supply and return air (mixing of warm air with cold air) can be prevented without provision of any partitions made of vinyl chloride sheets, panels or the like as in the background art, so that reduction of cooling efficiency can be avoided even without provision of any partitions (which will be described later in detail). The work for installing/moving partitions is not required so that installation can be performed inexpensively. Because there is no partition, a maintenance man can access the cold space easily so that maintainability of the server devices or the like can be improved. This is remarkably effective particularly when server racks 3 are provided additionally. As the frequency of additional provision becomes high, the effect becomes high.

For example, FIG. 5(a) can be regarded as showing a configuration example in the case where two server racks 3 are provided additionally from the state of FIG. 4.

Incidentally, in FIG. 5(a), the same constituent parts as shown in FIG. 4 are referred to by the same signs. That is, configuration is made so that the server racks 3A and 3B and the air conditioning devices 10A, 10B, 10C and 10D shown in the drawing are present in the state of FIG. 4.

The example of FIG. 5(a) shows the case where new server racks 3C and 3D are provided additionally at opposite ends of the row of rack composed of the two server racks 3A and 3B. In this case, the air conditioning devices 10C and 10D having formed air curtains in FIG. 4 are used for cooling the newly disposed server racks 3C and 3D respectively.

New air conditioning devices 10E and 10F are provided at opposite ends of row of the rack composed of the four air conditioning devices 10A, 10B, 10C and 10D. The air curtains are formed by the air conditioning devices 10E and 10F in place of the air conditioning devices 10C and 10D.

As described above, in this method, it is necessary to dispose a new air conditioning device 10 whenever a server rack 3 is provided additionally here. However, this is the same as when there is no air curtain used. When there is no air curtain used, the work for moving and re-installing a partition 52 described later is required in addition to the work for installing the new air conditioning device 10. In this method, such a work is not required so that the work load/cost due to additional provision of server racks 3 can be reduced.

In this method, two superfluous air conditioning devices 10 are initially installed, and the positions of air curtains can be moved naturally by a simple operation of additionally providing air conditioning devices 10 in accordance with additional provision of server racks 3 afterward.

Incidentally, as is obvious from FIG. 4, the cold space is just under the partition plate 7 shown in FIG. 5(a). On the other hand, return air ejected from each server rack 3 is basically returned to (the interior unit 10a of) the air conditioning device 10 but a hot space (HOT; space in which warm air stays) shown in the drawing may be formed due to leakage of part of the return air etc. In the example shown in the drawing, the cold space can be insulated from the hot space by the air curtains formed by the air conditioning devices 10E and 10F; thereby preventing occurrence of a situation that warm air or its heat in the hot space intrudes into the cold space to increase the temperature of the cold air and to reduce the cooling efficiency.

For comparison, FIG. 5(b) shows a configuration example in the case where the background art method is applied to the basic configuration of FIG. 1.

Also in the example shown in the drawing, the case where new server racks 3C and 3D are provided additionally at opposite ends of the row of the rack, respectively, from a state where two server racks 3A and 3B are disposed is taken as an example.

Incidentally, in this case, though it is not particularly shown in the drawings, air conditioning devices 10A and 10B shown in the drawing are disposed but air conditioning devices 10C and 10D are not disposed in a state where two server racks 3A and 3B are disposed. The positions of the partitions 52 are not positions corresponding to the server racks 3C and 3D as shown in the drawing but positions corresponding to the server racks 3A and 3B.

When two server racks 3C and 3D are provided additionally as shown in the drawing from the aforementioned state, air conditioning devices 10C and 10D are first disposed as shown in the drawing in accordance with these additionally provided racks. Moreover, the positions of the partitions 52 are moved to positions corresponding to the server racks 3C and 3D as shown in the drawing from positions corresponding to the server racks 3A and 3B not shown in the drawing.

When two server racks 3E and 3F are further provided additionally from the state of FIG. 5(b) as shown in FIG. 5(c), air conditioning devices 10E and 10F are disposed as shown in FIG. 5(c) in accordance with these additionally provided racks. Moreover, the positions of the partitions 52 are moved to positions corresponding to the server racks 3E and 3F as shown in FIG. 5(c) from positions corresponding to the server racks 3C and 3D in FIG. 5(b).

In this manner, extra labor and cost is taken for the work of moving the positions of the partitions 52.

Although labor for initially disposing two air conditioning devices 10 superfluously is taken in this method, labor for initially disposing the partitions 52 in positions corresponding to the server racks 3A and 3B not shown in the drawing is taken in the background art method shown in FIGS. 5(b) and 5(c). In this method, labor and cost can be reduced because the work of moving the positions of the partitions 52 whenever server racks 3 are provided additionally afterward is not required.

Incidentally, FIGS. 5(a) to 5(c) show the case where two rows of rack are provided as described with reference to FIG. 2. Although FIGS. 1 and 4 only show configuration according to one of the two rows of rack, FIGS. 5(a) to 5(c) show respective configurations according to the two rows of rack in the left and right of each drawing. Incidentally, the configuration shown in the right of each drawing is not referred to by signs or the like and not described particularly because it is substantially the same as the configuration shown in the left of each drawing.

Partition plates 51 shown in FIGS. 4 and 5(a) will be described here.

First, FIGS. 4 and 5(a) are based on a kind of modification. That is, in the example of FIGS. 1(a), 1(b) or FIGS. 2(a), 2(b), the partition wall 1 insulates the server room from outdoor air, and opposite ends of the partition wall 1 are not particularly shown but connected to the external wall 2 (laterally external wall 2).

On the other hand, in FIGS. 4 and 5(a), the partition wall 1 is provided additionally in a place of installation whenever a new air conditioning device 10 is disposed. Accordingly, as shown in the drawings, there is no partition wall 1 in a place where the air conditioning device 10 is not disposed. The total length of the partition wall 1 becomes long gradually in accordance with additional provision of the air conditioning device 10. Accordingly, the server room cannot be insulated from outdoor air as long as the air conditioning device 10 is not disposed up to the vicinity of the external wall 2 (laterally external wall 2). That is, as in the example shown in FIG. 5(a), the partition wall 1 is not connected to the external wall 2 (laterally external wall 2) and, accordingly, gaps are formed at opposite ends of the partition wall 1 as shown in the drawing so that the server room and the outside of the room (the outside of the building) cannot be separated from each other to generate a state where outdoor air intrudes into the server room.

For this reason, the partition plates 51 as shown in the drawing are disposed for the gaps formed at the opposite ends of the partition wall 1 in order to insulate the server room from outdoor air. Incidentally, this is an example and configuration is not limited to this example. If the partition wall 1 is initially disposed so that opposite ends of the partition wall 1 are connected to the external wall 2 (laterally external wall 2), it is unnecessary to dispose the partition plates 51 because the server room is insulated from outdoor air by the partition wall 1. In addition, when the air conditioning devices 10 are direct outdoor air cooling devices, it is unnecessary to dispose the partition plates 51 because it is unnecessary to insulate the server room from outdoor air.

According to the air conditioning system utilizing outdoor air according to the invention, it relates to an air conditioning system utilizing outdoor air for cooling indoor, in which unitized air conditioning devices are disposed in the vicinity of racks and disposed in such a manner that the width of each row of air conditioning device is larger than the width of each row of rack so that heating elements mounted in the racks can be cooled, and air curtains can be formed for preventing air supply and return air from being mixed with each other.

What is claimed is:

1. An air conditioning system utilizing outdoor air for cooling an indoor space wherein a rack is disposed, the rack having a heating element, comprising:
    at least one rack disposed in the indoor space, the rack having the heating element, an air inlet face and an air discharge face; and
    at least one air conditioning device using outdoor air for cooling and unitized in accordance with the at least one rack, the air conditioning device having an air supply face and a cold air supply unit for generating cold air and being disposed in a vicinity of the rack such that the air supply face faces the air inlet face to form a rack row and an air conditioning device row substantially parallel to the rack row, the rack row being formed of the at least one rack and the air conditioning device row being formed of the at least one air conditioning device,
    wherein the cold air supply unit feeds out cold air from the air supply face into a cold space between the rack row and the air conditioning device row to supply the cold air to the heating element and sucks warm air ejected from the air discharge face from a return air inlet to cool the warm air by using the outdoor air; and
    air conditioning devices are additionally disposed at two ends of the air conditioning device row to form air curtains at the two ends of the cold space.

2. The air conditioning system utilizing outdoor air according to claim 1, wherein the cold air supply units of the additional air conditioning devices feed out the cold air from the air supply faces thereof and suck the cold air into the return air inlets without supplying the cold air to the at least one rack, to form the air curtains.

3. The air conditioning system utilizing outdoor air according to claim 1, wherein when a new rack is added to at least one end of the rack row, the air conditioning device forming the air curtain is set as an air conditioning device facing the new rack and a new air conditioning device is additionally disposed at at least one end of the air conditioning device row to form the air curtain.

4. The air conditioning system utilizing outdoor air according to claim 1, further comprising a partition plate provided between a top portion of the air conditioning device and a top portion of the rack facing to the air conditioning device so that the warm air ejected from the rack and sucked from the return air inlet into the air conditioning device is prevented from flowing into the cold space.

5. The air conditioning system utilizing outdoor air according to claim 1, wherein the air conditioning device has a pair of units including an interior unit provided on an indoor side and an exterior unit provided on an outdoor side to put a partition wall between the indoor side and the outdoor side, the exterior unit having a first fan for sucking and ejecting the outdoor air and a first heat exchanger for performing heat exchange between the outdoor air sucked therein and a refrigerant, and the interior unit having a second fan for sucking the warm air and feeding out the cold air from the air supply face and a second heat exchanger for performing heat exchange between the warm air returned from the rack and the refrigerant to cool the warm air and to form the cold air; and a piping connected to the first heat exchanger and the second heat exchanger to circulate the refrigerant in the first heat exchanger and the second heat exchanger.

6. The air conditioning system utilizing outdoor air according to claim 5, wherein the rack row is provided substantially in parallel to the partition wall;
the air conditioning device row is provided substantially parallel to the partition wall; and
an external wall is provided substantially parallel to the partition wall outside the partition wall.

7. The air conditioning system utilizing outdoor air according to claim 6, wherein the exterior unit includes an outdoor air inlet and the external wall includes an outdoor air inlet hole,
the exterior unit is disposed in a space between the partition wall and the external wall such that the outdoor air inlet faces the outdoor air inlet hole.

8. The air conditioning system utilizing outdoor air according to claim 1, wherein the at least one air conditioning device further includes an exterior unit disposed in an outdoor space and connected to the cold air supply unit to cool the cold air supply unit, and the cold air supply unit is disposed in the indoor space separated from the outdoor space.

9. The air conditioning system utilizing outdoor air according to claim 8, wherein the exterior unit includes a first heat exchanger having a refrigerant flowing therethrough for performing heat exchange between the outdoor air and the refrigerant, and a first fan disposed in a vicinity of the first heat exchanger for circulating the outdoor air to cool the refrigerant in the first heat exchanger, and
the cold air supply unit includes a second heat exchanger connected to the first heat exchanger so that the refrigerant circulates therebetween, and a second fan for sucking the warm air from the return air inlet and feeding out the cold air from the air supply face while heat exchanging the warm air returning from the rack through the refrigerant.

10. The air conditioning system utilizing outdoor air according to claim 9, further comprising a partition plate extending between an upper portion of the air conditioning device and an upper portion of the rack to prevent the warm air, which is ejected from the rack and sucked from the return air inlet into the air conditioning device, from flowing into the cold space,
wherein the partition plate, the rack row, the air conditioning device row, and the two air curtains define the cold space in the indoor space.

11. An air conditioning system utilizing outdoor air for cooling an indoor space wherein a rack is disposed, the rack having a heating element, comprising:
at least one rack disposed in the indoor space, the rack having the heating element, an air inlet face and an air discharge face; and
at least one air conditioning device using outdoor air for cooling and unitized in accordance with the at least one rack, the air conditioning device having an air supply face and a cold air supply unit for generating cold air and being disposed in vicinity of the rack such that the air supply face faces the air inlet face to form a rack row and an air conditioning device row substantially parallel to the rack row, the rack row being formed of the at least one rack and the air conditioning device row being formed of the at least one air conditioning device,
wherein the cold air supply unit feeds out cold air from the air supply face into a cold space between the rack row and the air conditioning device row to supply the cold air to the heating element and sucks warm air ejected from the air discharge face from a return air inlet to cool the warm air by using the outdoor air; and
a horizontal width of the air conditioning device row is larger than a horizontal width of the rack row to form air curtains at two ends of the cold space.

* * * * *

UNITED STATES PATENT AND TRADEMARK OFFICE
CERTIFICATE OF CORRECTION

PATENT NO.         : 9,605,855 B2                          Page 1 of 1
APPLICATION NO.    : 13/993911
DATED              : March 28, 2017
INVENTOR(S)        : Masaki Takahashi et al.

It is certified that error appears in the above-identified patent and that said Letters Patent is hereby corrected as shown below:

In the Specification

Please change Column 9, Line 22, from "rack and ..." to --rack 3 and ...--.

Please change Column 15, Line 67, from "... devices (10C and 10D) ..." to --... devices 10 (10C and 10D) ...--.

Signed and Sealed this
Twenty-third Day of May, 2017

Michelle K. Lee
*Director of the United States Patent and Trademark Office*